(12) United States Patent
Haruta et al.

(10) Patent No.: US 7,511,508 B2
(45) Date of Patent: Mar. 31, 2009

(54) FIXTURE CHARACTERISTIC MEASURING DEVICE, METHOD, PROGRAM, RECORDING MEDIUM, NETWORK ANALYZER, AND SEMICONDUCTOR TEST DEVICE

(75) Inventors: Masato Haruta, Saitama (JP); Hiroyuki Konno, Saitama (JP); Naoya Kimura, Gunma (JP); Yoshikazu Nakayama, Saitama (JP)

(73) Assignee: Advantest Corporation, Tokyo (JP)

( * ) Notice: Subject to any disclaimer, the term of this patent is extended or adjusted under 35 U.S.C. 154(b) by 189 days.

(21) Appl. No.: 11/568,873

(22) PCT Filed: Jun. 13, 2005

(86) PCT No.: PCT/JP2005/011183

§ 371 (c)(1),
(2), (4) Date: Jan. 12, 2007

(87) PCT Pub. No.: WO2006/001234

PCT Pub. Date: Jan. 5, 2006

(65) Prior Publication Data

US 2007/0222455 A1    Sep. 27, 2007

(30) Foreign Application Priority Data

Jun. 28, 2004    (JP) ............................... 2004-190259

(51) Int. Cl.
*G01R 31/04*    (2006.01)
*G01R 35/00*    (2006.01)

(52) U.S. Cl. ..................................... 324/538; 324/601

(58) Field of Classification Search .................. 324/538, 324/601
See application file for complete search history.

(56) References Cited

U.S. PATENT DOCUMENTS

| 5,578,932 | A  | * | 11/1996 | Adamian  | 324/601 |
| 6,643,597 | B1 | * | 11/2003 | Dunsmore | 702/104 |
| 6,960,920 | B2 | * | 11/2005 | Kamitani | 324/601 |
| 7,034,548 | B2 | * | 4/2006  | Anderson | 324/600 |
| 2005/0289392 | A1 | | 12/2005 | Haruta et al. | |

FOREIGN PATENT DOCUMENTS

| JP | 8-015348  | 1/1996 |
| JP | 11-038054 | 2/1999 |

OTHER PUBLICATIONS

English Language Abstract of JP 11-038054.
English Language Abstract of JP 8-015348.
U.S. Appl. No. 10/572,381 to Haruta et al., filed Mar. 16, 2006.
U.S. Appl. No. 10/598,201 to Nakayama et al., filed Aug. 21, 2006.
U.S. Appl. No. 10/599,124 to Nakayama et al., filed Sep. 20, 2006.

* cited by examiner

*Primary Examiner*—Timothy J Dole
(74) *Attorney, Agent, or Firm*—Greenblum & Bernstein, P.L.C.

(57) ABSTRACT

There are measured characteristics of a jig (fixture) used to calculate and measure circuit parameters of a device under test. There is provided a jig characteristic measuring device which measures the jig characteristics of a jig which includes signal lines used to connect a DUT and a network analyzer with each other (namely, the reflection characteristics of the signal lines, and the transmission S parameters), measures the reflection coefficients of the signal lines in an open state where the DUT is not connected to the signal lines measures the reflection coefficients of the signal lines in a short-circuit state where all the signal lines are grounded, and derives the jig characteristics of the jig based on these measured results.

16 Claims, 9 Drawing Sheets

(a)

(b)

Open State

Short-Circuit State

FIXTURE CHARACTERISTIC MEASURING DEVICE, METHOD, PROGRAM, RECORDING MEDIUM, NETWORK ANALYZER, AND SEMICONDUCTOR TEST DEVICE

TECHNICAL FIELD

The present invention relates to a measurement of characteristics of a jig (fixture) used to measure and calculate circuit parameters of a device under test.

BACKGROUND ART

Conventionally, there have been measured circuit parameters (such as the S parameters) of a device under test (DUT) (refer to a patent document 1 (Japanese Laid-Open Patent Publication (Kokai) No. H11-38054), for example.

Specifically, a signal is transmitted from a signal source to a receiving unit via the DUT. The signal is received by the receiving unit. It is possible to acquire the S parameters and frequency characteristics of the DUT by measuring the signal received by the receiving unit.

On this occasion, measuring system errors are generated in the measurement due to mismatching between a measuring system such as the signal source and the DUT, and the like. These measuring system errors include Ed: error caused by the direction of a bridge, Er: error caused by frequency tracking, and Es: error caused by source matching.

On this occasion, it is possible to correct the errors according to the patent document 1, for example. The correction in this way is referred to as calibration. A brief description will now be given of the calibration. Calibration kits are connected to the signal source to realize three types of states: open, short-circuit, and load (standard load Z0). In these states, a signal reflected from the respective calibration kits is acquired by a bridge to obtain three types of the S parameter corresponding to the three types of state. The three types of variable Ed, Er, and Es are acquired from the three types of the S parameter.

Moreover, the DUT is fixed to a jig (fixture), and the DUT is connected to a measuring system (such as a network analyzer) via the jig. On this occasion, the errors caused by the measuring system (network analyzer) can be calibrated as described above. Moreover, if transmission line characteristics of the jig are proper, only the phase of a signal supplied from the measuring system to the jig changes due to the jig. Therefore, the phase can be calibrated according to the length of a transmission line of the jig.

However, if a high frequency signal is supplied to the DUT, it is difficult to manufacture a jig having a proper transmission line characteristic. The jig thus causes a loss to a signal supplied from the measuring system to the jig. On this occasion, if only the phase is calibrated, the measurement accuracy decreases. It is thus preferable to carry out more precise calibration by measuring the characteristics of the jig.

It is thus an object of the present invention to measure the characteristics of a jig (fixture) used to measure and calculate circuit parameters of a device under test.

DISCLOSURE OF THE INVENTION

According to the present invention, a fixture characteristic measuring device that measures a fixture characteristic of a fixture that includes a signal line used to connect a device under test and a measuring device used to measure a characteristic of the device under test with each other, includes: a first reflection coefficient measuring unit that measures a reflection coefficient of the signal line in an open state where the device under test is not connected to the signal line; a second reflection coefficient measuring unit that measures a reflection coefficient of the signal line in a short-circuit state where all the signal line is short-circuited; and a fixture characteristic deriving unit that derives the fixture characteristic based on a measured result by the first reflection coefficient measuring unit, and a measured result by the second reflection coefficient measuring unit.

According to the thus constructed fixture characteristic measuring device, a fixture characteristic measuring device that measures a fixture characteristic of a fixture that includes a signal line used to connect a device under test and a measuring device used to measure a characteristic of the device under test with each other, can be provided.

A first reflection coefficient measuring unit measures a reflection coefficient of the signal line in an open state where the device under test is not connected to the signal line. A second reflection coefficient measuring unit measures a reflection coefficient of the signal line in a short-circuit state where all the signal line is short-circuited. A fixture characteristic deriving unit derives the fixture characteristic based on a measured result by the first reflection coefficient measuring unit, and a measured result by the second reflection coefficient measuring unit.

According to the fixture characteristic measuring device of the present invention, the fixture may include: a base board that carries the device under test and the signal line on a front surface, and a ground electric potential portion on a rear surface; and a through hole that opens on the front surface, and is connected to the ground electric potential portion.

According to the fixture characteristic measuring device of the present invention, the open state may be a state where the device under test is not placed on the fixture.

According to the fixture characteristic measuring device of the present invention, the short-circuit state may be a state where the signal line and a metalized portion connected to the through hole are placed on the front surface.

According to the fixture characteristic measuring device of the present invention, the fixture characteristic deriving unit may derive the square root of the absolute value of a product of the measured result by the first reflection coefficient measuring unit and the measured result by the second reflection coefficient measuring unit as the fixture characteristic.

According to the fixture characteristic measuring device of the present invention, the fixture characteristic deriving unit may derive the one-fourth power of the absolute value of a product of the measured result by the first reflection coefficient measuring unit and the measured result by the second reflection coefficient measuring unit as the fixture characteristic.

According to the present invention, a network analyzer may include: the above mentioned fixture characteristic measuring device and a result obtained by measuring the device under test may be corrected based on the fixture characteristic derived by the fixture characteristic measuring device.

According to the present invention, a semiconductor test device may include: the above mentioned fixture characteristic measuring device, and a result obtained by measuring the device under test may be corrected based on the fixture characteristic derived by the fixture characteristic measuring device.

According to the present invention, a fixture characteristic measuring method that measures a fixture characteristic of a fixture that includes a signal line used to connect a device under test and a measuring device used to measure a characteristic of the device under test with each other, may include: a first reflection coefficient measuring step of measuring a reflection coefficient of the signal line in an open state where the device under test is not connected to the signal line; a second reflection coefficient measuring step of measuring a reflection coefficient of the signal line in a short-circuit state where all the signal line is short-circuited; and a fixture characteristic deriving step of deriving the fixture characteristic based on a measured result by the first reflection coefficient measuring step, and a measured result by the second reflection coefficient measuring step.

The present invention is a program of instructions for execution by the computer to perform a fixture characteristic measuring process that measures a fixture characteristic of a fixture that includes a signal line used to connect a device under test and a measuring device used to measure a characteristic of the device under test with each other, the fixture characteristic measuring process including: a first reflection coefficient measuring step of measuring a reflection coefficient of the signal line in an open state where the device under test is not connected to the signal line; a second reflection coefficient measuring step of measuring a reflection coefficient of the signal line in a short-circuit state where all the signal line is short-circuited; and a fixture characteristic deriving step of deriving the fixture characteristic based on a measured result by the first reflection coefficient measuring step, and a measured result by the second reflection coefficient measuring step.

The present invention is a computer-readable medium having a program of instructions for execution by the computer to perform a fixture characteristic measuring process that measures a fixture characteristic of a fixture that includes a signal line used to connect a device under test and a measuring device used to measure a characteristic of the device under test with each other, the fixture characteristic measuring process including: a first reflection coefficient measuring step of measuring a reflection coefficient of the signal line in an open state where the device under test is not connected to the signal line; a second reflection coefficient measuring step of measuring a reflection coefficient of the signal line in a short-circuit state where all the signal line is short-circuited; and a fixture characteristic deriving step of deriving the fixture characteristic based on a measured result by the first reflection coefficient measuring step, and a measured result by the second reflection coefficient measuring step.

BEST MODE FOR CARRYING OUT THE INVENTION

A description will now be given of an embodiment of the present invention with reference to drawings.

Figure 1:
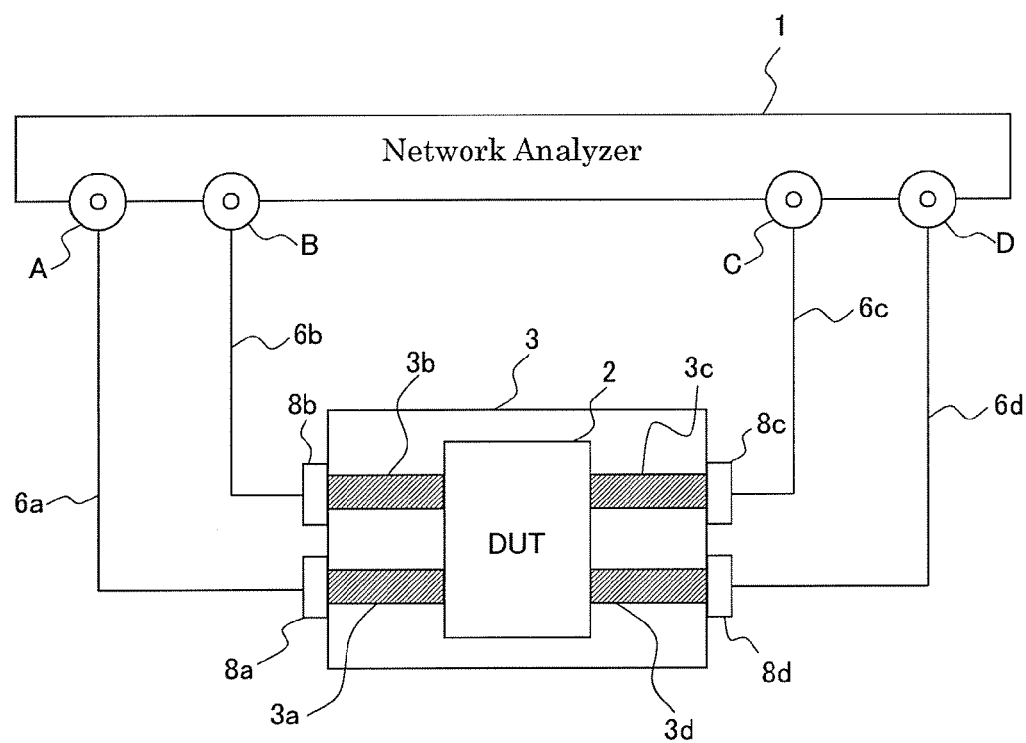
FIG. 1 shows connections between a network analyzer 1 and a DUT 2 when characteristics of the DUT 2 fixed to a jig 3 are measured by the network analyzer 1 which includes a jig characteristic measuring device according to an embodiment of the present invention.

FIG. 1 shows connections between a network analyzer 1 and a DUT 2 when characteristics of the DUT 2 fixed to a jig (fixture) 3 are measured by the network analyzer 1 which includes a jig characteristic measuring device according to the embodiment of the present invention. The network analyzer 1 is a measuring device used to measure the characteristics of the DUT 2.

The DUT 2 implies a Device Under Test. The DUT 2 is mounted on a front surface of the jig 3. Signal lines 3*a*, 3*b*, 3*c*, and 3*d* are provided on the front surface of the jig 3, and are connected to the DUT 2. The network analyzer 1 includes ports A, B, C, and D. The ports A, B, C, and D are ports used to transmit/receive signals. The port A is connected to a cable 6*a*. The port B is connected to a cable 6*b*. The port C is connected to a cable 6*c*. The port D is connected to a cable 6*d*. The cable 6*a* is connected to a signal line 3*a* via a connector 8*a*. The cable 6*b* is connected to a signal line 3*b* via a connector 8*b*. The cable 6*c* is connected to a signal line 3*c* via a connector 8*c*. The cable 6*d* is connected to a signal line 3*d* via a connector 8*d*. The signal lines 3*a*, 3*b*, 3*c*, and 3*d* thus connect the DUT 2 and the network analyzer 1 with each other.

Figure 2:
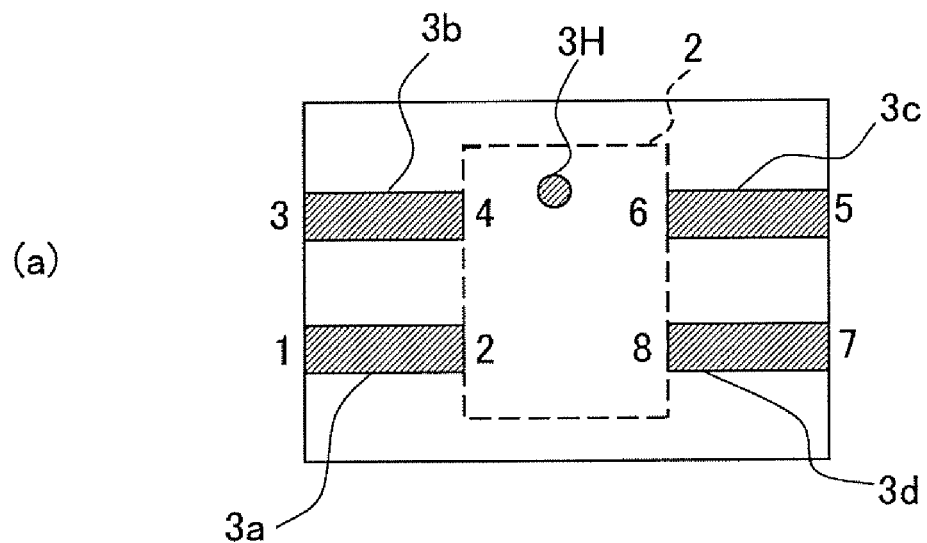
FIG. 2(*a*) and FIG. 2(*b*) are respectively a plan view and a cross sectional view of the jig 3.
Figure 2:
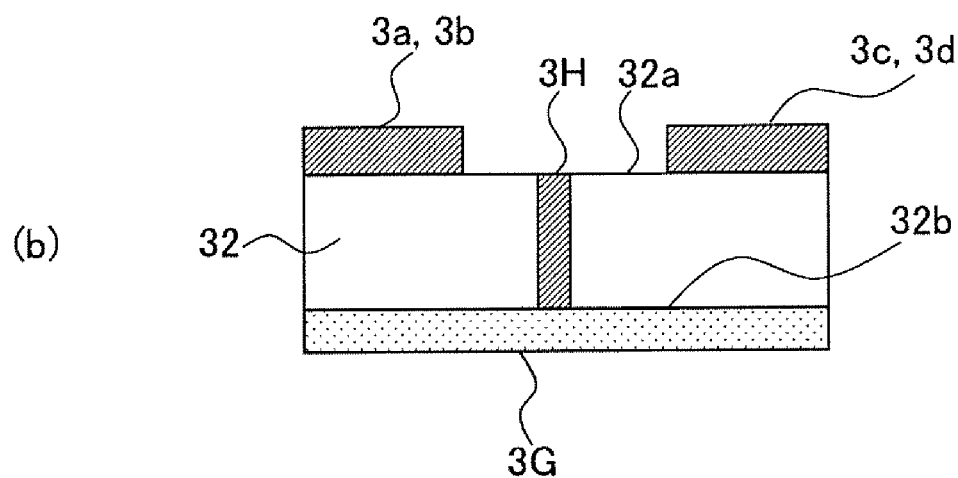

FIG. 2(*a*) and FIG. 2(*b*) are respectively a plan view and a cross sectional view of the jig (fixture) 3. It should be noted that a dotted line shows a position at which the DUT 2 is placed in FIG. 2(*a*). The jig 3 includes a base board 32 and a thorough hole 3H.

On a front surface 32*a* of the base board 32 of the jig 3 (refer to FIG. 2(*b*)) are provided the DUT 2 and the signal lines 3*a*, 3*b*, 3*c*, and 3*d*, and is opened the thorough hole 3H (refer to FIG. 2(*a*)). An end on a connector 8*a* side and an end on a DUT 2 side of the signal line 3*a* are respectively denoted by 1 and 2. An end on a connector 8*b* side and an end on a DUT 2 side of the signal line 3*b* are respectively denoted by 3 and 4. An end on a connector 8*c* side and an end on a DUT 2 side of the signal line 3*c* are respectively denoted by 5 and 6. An end on a connector 8*d* side and an end on a DUT 2 side of the signal line 3*d* are respectively denoted by 7 and 8. The DUT 2 includes four ports respectively corresponding to the terminals 2, 4, 6, and 8. With reference to FIG. 2(*b*), the through hole 3H opens on the front surface 32*a* of the base board 32, runs through the base board 32, and is connected to a ground electric potential portion 3G provided on a rear surface 32*b* of the base board 32. The ground electric potential portion 3G corresponds to so-called "GND", and maintains an electric potential of grounding.

With reference again to FIG. 1, the network analyzer 1 outputs a measuring signal from any one of the ports A, B, C, and D (such as port A). The measuring signal is supplied to the signal line 3*a* via the cable 6*a*, and then the connector 8*a*. Moreover, the measuring signal is supplied to the DUT 2 via the signal line 3*a*. The DUT 2 receives the measuring signal, and outputs a response signal. The response signal passes one of the signal lines 3*a*, 3*b*, 3*c*, and 3*d* (such as the signal line 3*b*). The response signal is further supplied to the port B via the connector 8*b*, and then the cable 6*b*. The response signal supplied to the port B is measured by the network analyzer 1. In this way, the characteristics of the DUT 2 are measured by the network analyzer 1.

Data obtained by the network analyzer 1 by measuring the signal supplied from the DUT 2 includes (1) errors generated by the network analyzer 1 and the cables 6a, 6b, 6c, and 6d (referred to as "measuring device errors"), and (2) errors generated by the signal lines 3a, 3b, 3c, and 3d (referred to as "jig characteristics (fixture characteristics")). The measuring device errors are measured by a calibration method which has conventionally been well-known. The present embodiment is thus characterized by how to measure the jig characteristics.

In order to measure the jig characteristics, it is necessary to realize an open state (refer to FIG. 3) and a short-circuit state (refer to FIG. 4) on the jig 3, and to measure the respective reflection coefficients of the signal lines 3a, 3b, 3c, and 3d in the respective states.

Figure 3:
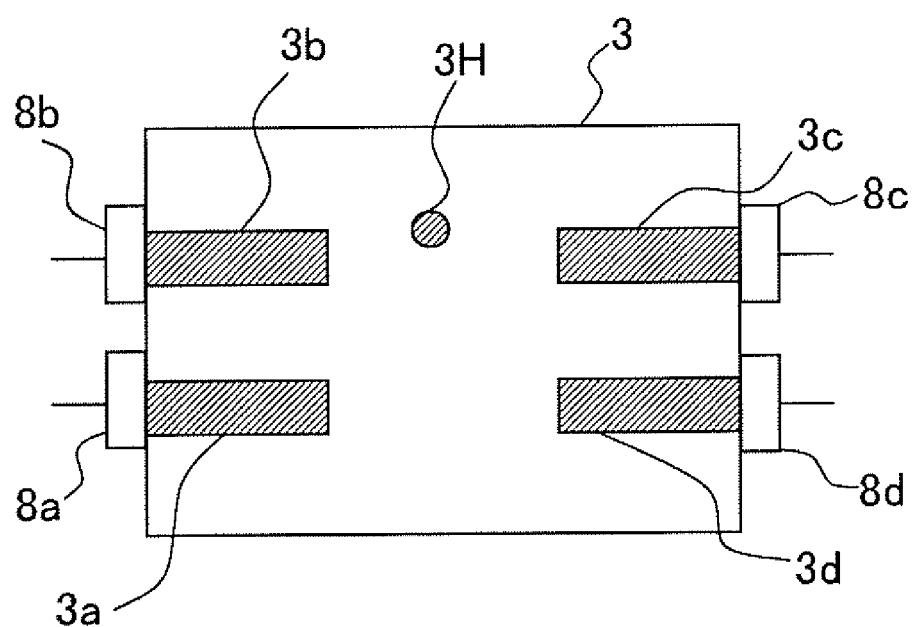
FIG. 3 is a plan view showing the jig 3 in the open state.

FIG. 3 is a plan view showing the jig 3 in the open state. In the open state, the DUT 2 is not connected to the signal lines 3a, 3b, 3c, and 3d. Namely, none is connected to the terminal 2 on the DUT 2 side of the signal line 3a, the terminal 4 on the DUT 2 side of the signal line 3b, the terminal 6 on the DUT 2 side of the signal line 3c, and the terminal 8 on the DUT 2 side of the signal line 3d. The open state is a state where the DUT 2 is not mounted on the front surface 32a of the base board 32 of the jig 3, and can thus be realized by removing the DUT 2 from the jig 3.

FIG. 4(a) and FIG. 4(b) are respectively a plan view and a cross sectional view of the jig 3 in the short-circuit state. The short-circuit state is a state where the all the signal lines 3a, 3b, 3c, and 3d are grounded. With reference to FIG. 4(a), a metalized portion 3S is a metal plate which has the same size (area) as that of the DUT 2. The metalized portion 3S is mounted on the front surface 32a, and is connected to the signal lines 3a, 3b, 3c, and 3d. Moreover, the metalized portion 3S covers the through hole 3H, and is thus connected to the through hole 3H (refer to FIG. 4(b)). Since the through hole 3H is connected to the ground electric potential portion 3G, the metalized portion 3S is grounded. As a result, all the signal lines 3a, 3b, 3c, and 3d are grounded.

Figure 5:
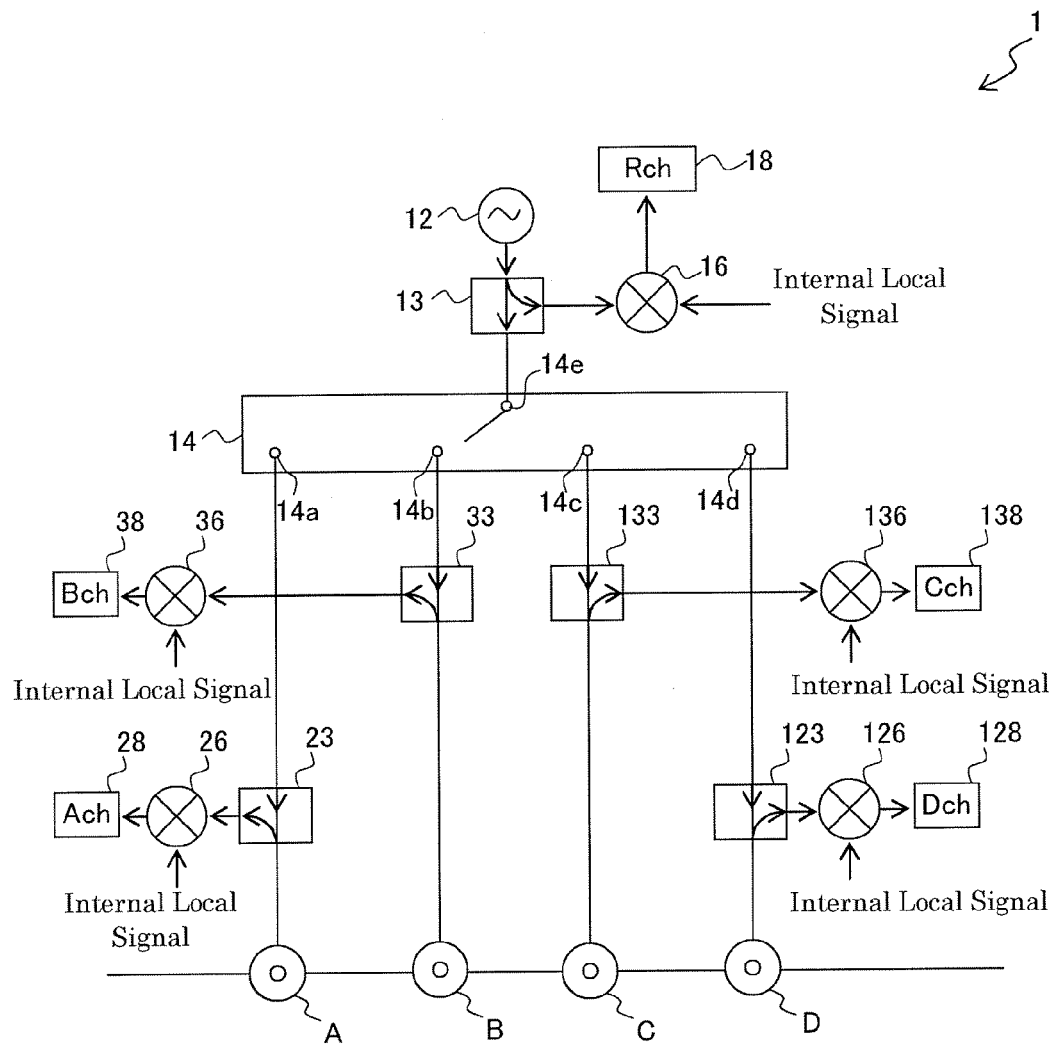
FIG. 5 is a block diagram showing a configuration of the network analyzer 1.

FIG. 5 is a block diagram showing a configuration of the network analyzer 1. It should be noted that the jig characteristic measuring device is not illustrated. The network analyzer 1 includes a signal output unit 12, a bridge 13, a switch 14, an internal mixer 16, a receiver (Rch) 18, a bridge 23, an internal mixer 26, a receiver (Ach) 28, a bridge 33, an internal mixer 36, a receiver (Bch) 38, a bridge 123, an internal mixer 126, a receiver (Dch) 128, a bridge 133, an internal mixer 136, and a receiver (Cch) 138 in addition to the jig characteristic measuring device, which is not illustrated.

The signal output unit 12 outputs the measuring signal. The bridge 13 supplies the internal mixer 16 and the switch 14 with the measuring signal output from the signal output unit 12. The switch 14 includes terminals 14a, 14b, 14c, 14d, and 14e. The terminal 14e is connected to the bridge 13, and receives the signal from the bridge 13. The terminal 14e is to be connected to one of the terminals 14a, 14b, 14c, and 14d. The internal mixer 16 mixes the measuring signal supplied from the bridge 13 with an internal local signal, and outputs the mixed signal. The receiver (Rch) 18 measures the signal output from the internal mixer 16. For example, the receiver (Rch) 18 measures the power of the signal.

The bridge 23 is connected to the terminal 14a, and outputs the measuring signal, which is supplied from the signal output unit 12 via the bridge 13 and then the switch 14, to the port A. Moreover, the bridge 23 receives the measuring signal which has been reflected and returned back, and a response signal output from the DUT 2 via the port A, and supplies the internal mixer 26 with the measuring signal and the response signal. The internal mixer 26 mixes the signal supplied from the bridge 23 with an internal local signal, and outputs the mixed signal. The receiver (Ach) 28 measures the signal output from the internal mixer 26. For example, the receiver (Ach) 28 measures the power of the signal.

The bridge 33 is connected to the terminal 14b, and outputs the measuring signal, which is supplied from the signal output unit 12 via the bridge 13 and then the switch 14, to the port B. Moreover, the bridge 33 receives the measuring signal which has been reflected and returned back, and a response signal output from the DUT 2 via the port B, and supplies the internal mixer 36 with the measuring signal and the response signal. The internal mixer 36 mixes the signal supplied from the bridge 33 with an internal local signal, and outputs the mixed signal. The receiver (Bch) 38 measures the signal output from the internal mixer 36. For example, the receiver (Bch) 38 measures the power of the signal.

The bridge 133 is connected to the terminal 14c, and outputs the measuring signal, which is supplied from the signal output unit 12 via the bridge 13 and then the switch 14, to the port C. Moreover, the bridge 133 receives the measuring signal which has been reflected and returned back, and a response signal output from the DUT 2 via the port C, and supplies the internal mixer 136 with the measuring signal and the response signal. The internal mixer 136 mixes the signal supplied from the bridge 133 with an internal local signal, and outputs the mixed signal. The receiver (Cch) 138 measures the signal output from the internal mixer 136. For example, the receiver (Cch) 138 measures the power of the signal.

The bridge 123 is connected to the terminal 14d, and outputs the measuring signal, which is supplied from the signal output unit 12 via the bridge 13 and then the switch 14, to the port D. Moreover, the bridge 123 receives the measuring signal which has been reflected and returned back, and a response signal output from the DUT 2 via the port D, and supplies the internal mixer 126 with the measuring signal and the response signal. The internal mixer 126 mixes the signal supplied from the bridge 123 with an internal local signal, and outputs the mixed signal. The receiver (Dch) 128 measures the signal output from the internal mixer 126. For example, the receiver (Dch) 128 measures the power of the signal.

The measured results by the receiver (Rch) 18, the receiver (Ach) 28, the receiver (Bch) 38, the receiver (Cch) 138, and the receiver (Dch) 128 are transmitted to the jig characteristic measuring device, which is not illustrated.

Figure 6:
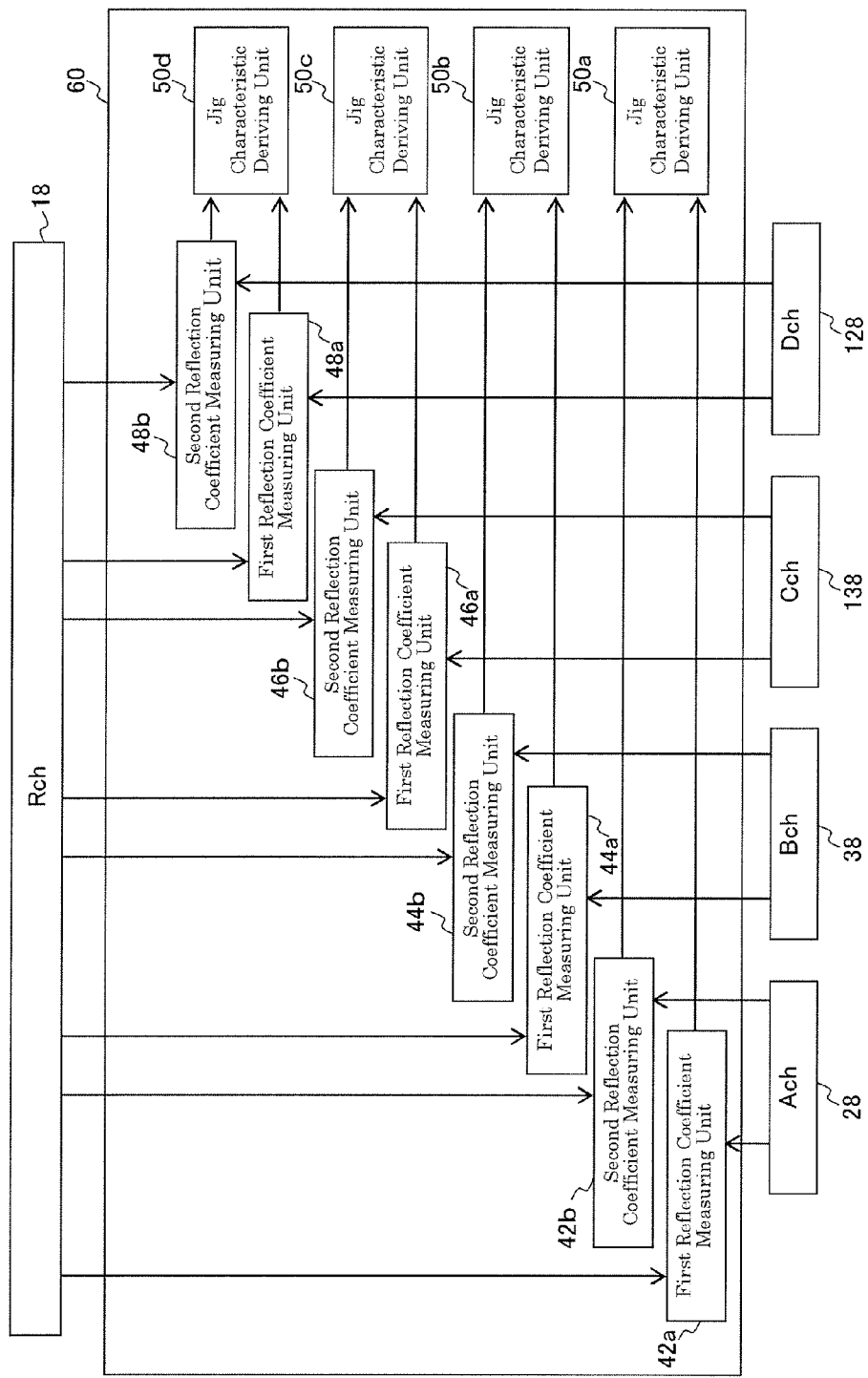
FIG. 6 is a block diagram showing a configuration of a jig characteristic measuring device 60.

FIG. 6 is a block diagram showing a configuration of the jig characteristic measuring device (fixture characteristic measuring device) 60. The jig characteristic measuring device 60 includes first reflection coefficient measuring units 42a, 44a, 46a, and 48a, second reflection coefficient measuring units 42b, 44b, 46b, and 48b, and jig characteristic deriving units (fixture characteristic deriving means) 50a, 50b, 50c, and 50d based on these measured results.

The first reflection coefficient measuring unit 42a receives the measured results by the receiver (Rch) 18 and the receiver (Ach) 28 in the open state (refer to FIG. 3), and acquires a reflection coefficient (SAAopen) of the signal line 3a based on these measured results.

The second reflection coefficient measuring unit 42b receives the measured results by the receiver (Rch) 18 and the receiver (Ach) 28 in the short-circuit state (refer to FIG. 4), and acquires a reflection coefficient (SAAshort) of the signal line 3a.

The jig characteristic deriving unit 50a receives the reflection coefficients SAAopen and SAAshort of the signal line 3a, and derives the characteristics of the signal line 3a (jig characteristic) based thereon. The characteristic of the signal line 3a (jig characteristic) may be a ratio (reflection characteristic) of a signal, which is made incident to the terminal 1 of the signal line 3a on the connector 8a side, and is reflected back to the terminal 1 via the terminal 2 of the DUT 2 side when the DUT 2 is not connected.

Figure 7:
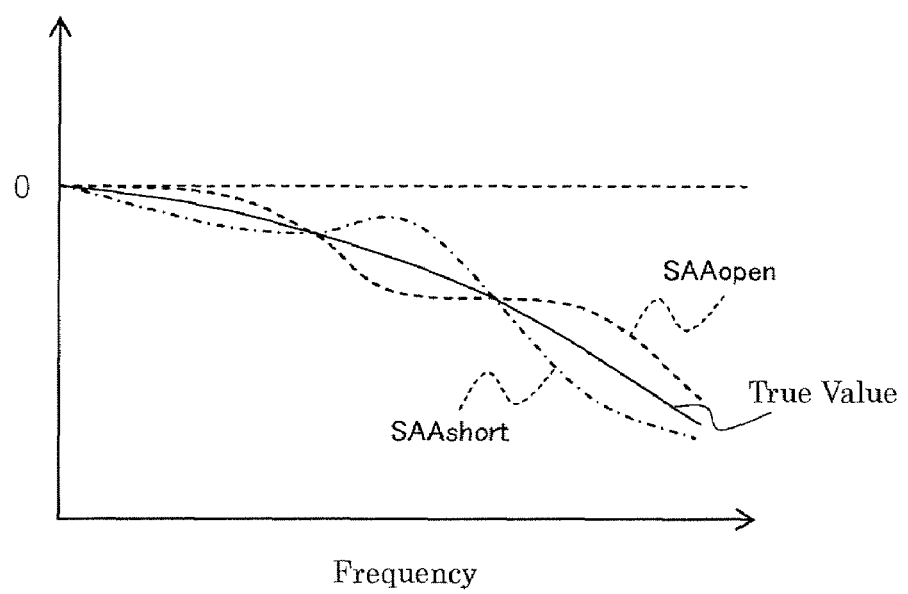
FIG. 7 shows a relationship among the true value of the reflection characteristic of a signal line 3*a*, and the reflection coefficients SAAopen and SAAshort of the signal line 3*a*.

FIG. 7 shows a relationship among the true value of the reflection characteristic of the signal line 3a, and the reflection coefficients SAAopen and SAAshort of the signal line 3a. When a signal at a low frequency is supplied to the signal line 3a, there is hardly present a loss by the reflection. As a result, the power of the signal supplied to the signal line 3a, and the power of the signal reflected by the signal line 3a are approximately equal to each other, and the reflection characteristic is thus almost 0[dB]. However, when a signal at a high frequency is supplied to the signal line 3a, the loss by the reflection increases. As a result, the power of the signal reflected by the signal line 3a decreases compared with the power of the signal supplied to the signal line 3a. The reflection characteristic thus decreases below 0[dB] as the frequency increases. Namely, as the frequency increases, the true value of the reflection coefficient decreases.

On this occasion, the reflection coefficients SAAopen and SAAshort of the signal line 3a repeatedly become above and below the true value of the reflection characteristic, and decrease as the frequency increases. The phase of SAAopen is a reversed phase of the SAAshort. As a result, there holds: characteristic (reflection characteristic) of the signal line $3a = (SAAopen \times (-SAAshort))^{1/2}$ (namely, square root of $(SAAopen) \times (-SAAshort)$). It should be noted that SAAshort is multiplied by −1 in order to make SAAshort, which has a sign opposite to that of SAAopen, have the same sign by reversing the phase. SAAopen×(−SAAshort) is thus the absolute value of SAAopen×SAAshort.

Figure 8:
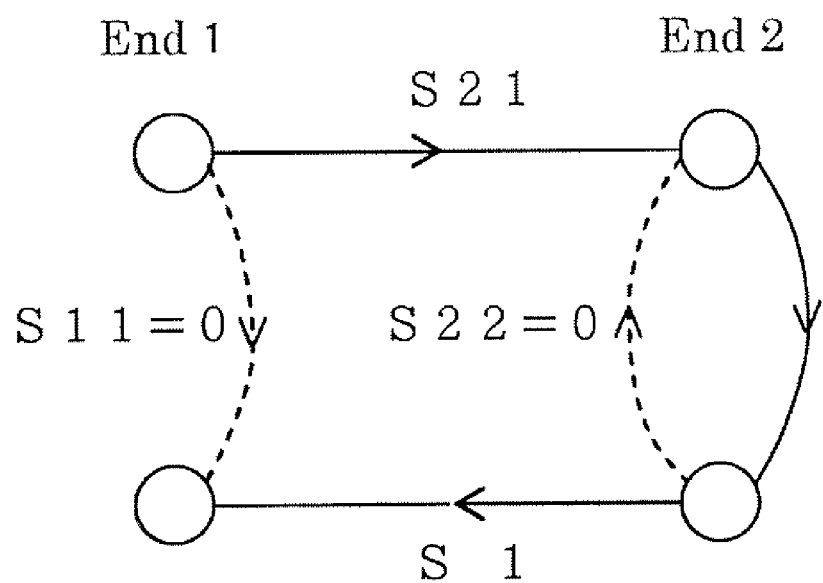
FIG. 8 is a signal flow diagram of the signal line 3*a*.

FIG. 8 is a signal flow diagram of the signal line 3a. It is assumed that the reflection S parameters of the signal line 3a are ideal, namely, S11=S22=0. It is also assumed that the transmission S parameters S21 and S12 of the signal line 3a are equal to each other. The transmission S parameters S21 and S12 of the signal line 3a according to this assumption may be derived as the characteristics (jig characteristics) of the signal line 3a by the jig characteristic deriving unit 50a. Since S21×S12=the characteristic (reflection characteristic) of the signal line 3a, S21=S12=characteristic (reflection characteristic)$^{1/2}$ of the signal line $3a=(SAAopen \times (-SAAshort))^{1/4}$ (namely, one-fourth power of (SAAopen× (−SAAshort))).

It should be noted that the jig characteristic deriving unit 50a may derive the characteristic (reflection characteristic) of the signal line 3a, and further derives the transmission S parameters S21 and S12 of the signal line 3a based on the characteristic (reflection characteristic) of the signal line 3a.

Similarly, the first reflection coefficient measuring unit 44a receives the measured results by the receiver (Rch) 18 and the receiver (Bch) 38 in the open state (refer to FIG. 3), and acquires a reflection coefficient (SBBopen) of the signal line 3b based on these measured results. The second reflection coefficient measuring unit 44b receives the measured results by the receiver (Rch) 18 and the receiver (Bch) 38 in the short-circuit state (refer to FIG. 4) and acquires a reflection coefficient (SBBshort) of the signal line 3b based on these measured results. The jig characteristic deriving unit 50b receives the reflection coefficients SBBopen and SBBshort of the signal line 3b, and derives the characteristics (jig characteristic) of the signal line 3b based thereon. The characteristics (jig characteristics) of the signal line 3b are at least one of the reflection characteristic of the signal line 3b and the transmission S parameters S43 and S34 of the signal line 3b.

Similarly, the first reflection coefficient measuring unit 46a receives the measured results by the receiver (Rch) 18 and the receiver (Cch) 138 in the open state (refer to FIG. 3) and acquires a reflection coefficient (SCCopen) of the signal line 3c based on these measured results. The second reflection coefficient measuring unit 46b receives the measured results by the receiver (Rch) 18 and the receiver (Cch) 138 in the short-circuit state (refer to FIG. 4) and acquires a reflection coefficient (SCCshort) of the signal line 3c based on these measured results. The jig characteristic deriving unit 50c receives the reflection coefficients SCCopen and SCCshort of the signal line 3c, and derives the characteristics (jig characteristic) of the signal line 3c based thereon. The characteristics (jig characteristics) of the signal line 3c are at least one of the reflection characteristic of the signal line 3c and the transmission S parameters S65 and S56 of the signal line 3c.

Similarly, the first reflection coefficient measuring unit 48a receives the measured results by the receiver (Rch) 18 and the receiver (Dch) 128 in the open state (refer to FIG. 3) and acquires a reflection coefficient (SDDopen) of the signal line 3d based on these measured results. The second reflection coefficient measuring unit 48b receives the measured results by the receiver (Rch) 18 and the receiver (Dch) 128 in the short-circuit state (refer to FIG. 4) and acquires a reflection coefficient (SDDshort) of the signal line 3d based on these measured results. The jig characteristic deriving unit 50d receives the reflection coefficients SDDopen and SDDshort of the signal line 3d, and derives the characteristics (jig characteristic) of the signal line 3d based thereon. The characteristics (jig characteristics) of the signal line 3d are at least one of the reflection characteristic of the signal line 3d and the transmission S parameters S87 and S78 of the signal line 3d.

Figure 9:
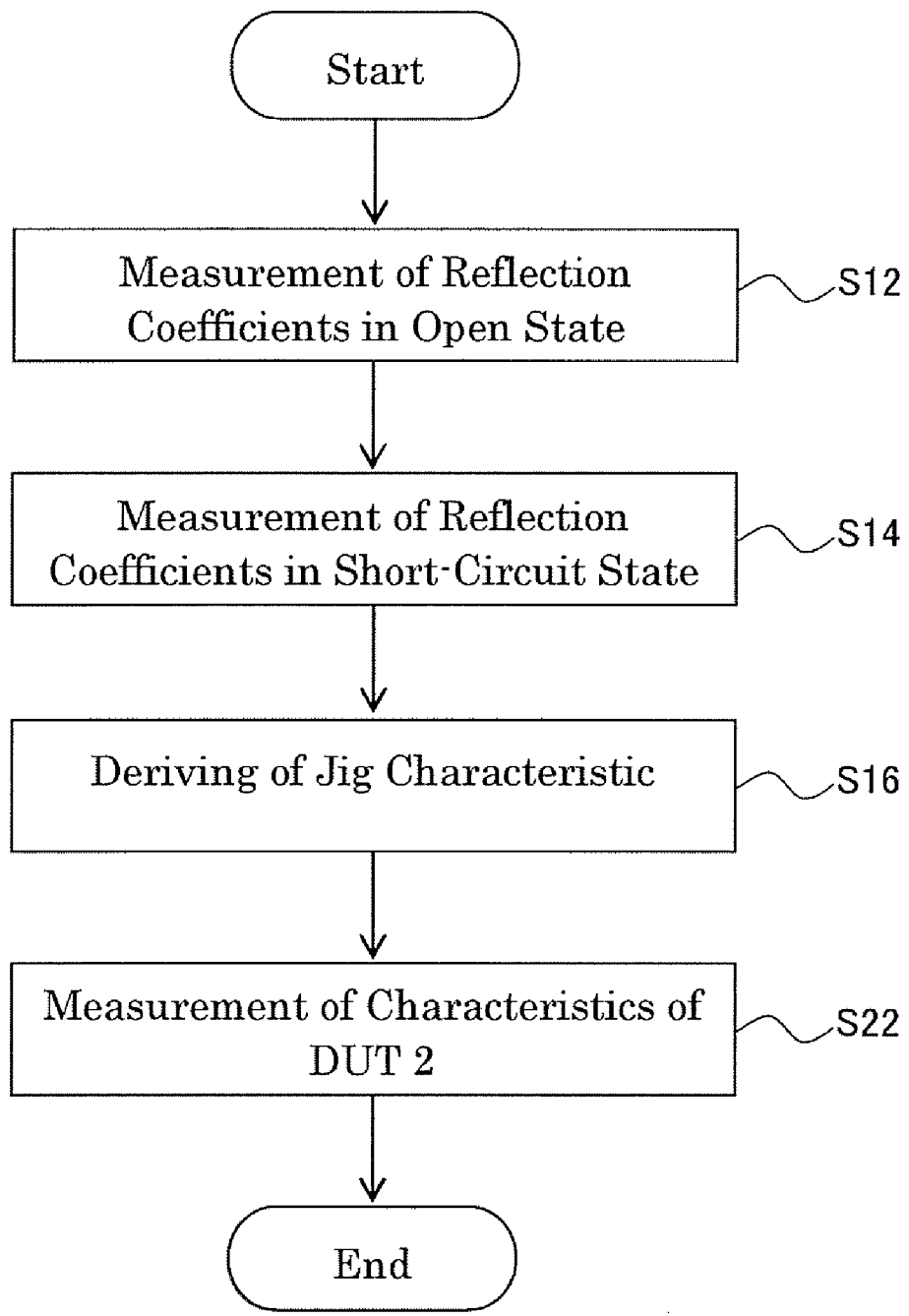
FIG. 9 is a flowchart showing an operation of the embodiment of the present invention.

A description will now be given of an operation of the embodiment of the present invention with reference to a flowchart in FIG. 9.

The open state (refer to FIG. 3) is first provided, and the first reflection coefficient measuring units 42a, 44a, 46a, and 48a respectively measure the reflection coefficients SAAopen, SBBopen, SCCopen, and SDDopen of the signal lines 3a, 3b, 3c, and 3d in this state (S12).

The short-circuit state (refer to FIG. 4) is then provided, and the second reflection coefficient measuring units 42b, 44b, 46b, and 48b respectively measure the reflection coefficients SAAshort, SBBshort, SCCshort, and SDDshort of the signal lines 3a, 3b, 3c, and 3d in this state (S14).

The jig characteristic deriving units 50a, 50b, 50c, and 50d then derive the characteristics (jig characteristics) of the signal lines 3a, 3b, 3c, and 3d based on the reflection coefficients SAAopen, SBBopen, SCCopen, and SDDopen, and the reflection coefficients SAAshort, SBBshort, SCCshort, and SDDshort (S16). For example, the jig characteristic deriving units 50a, 50b, 50c, and 50d may derive the reflection characteristic of the signal lines 3a, 3b, 3c, and 3d, or may derive the transmission S parameters S21, S12, S43, S34, S65, S56, S87, and S78 of the signal lines 3a, 3b, 3c, and 3d.

Finally, the DUT 2 is attached to the jig 3, and the characteristics of the DUT 2 are measured (S22). Specifically, the network analyzer 1 outputs a measuring signal from any one of the ports A, B, C, and D, and supplies the DUT 2 with the signal via the jig 3. The DUT 2 receives the measuring signal, and outputs a response signal. The network analyzer 1 receives the response signal from at least one of the ports A, B, C, and D, and measures the response signal. For example, the network analyzer 1 measures the power of the response signal.

On this occasion, the measured result of the response signal includes (1) measuring device errors, and (2) jig characteristics. The measuring device errors can be measured by a calibration method which has conventionally been well-known. This calibration method is well-known, and hence a description thereof is omitted. The jig characteristics can be measured as described above. The measured (1) measuring device errors and (2) jig characteristics are removed from the measured result of the response signal. Namely, the measured result is calibrated.

Though the description has been given of such a case that the DUT 2 has the four ports, the embodiment of the present invention can be realized independently of the number of the ports of the DUT 2. Though the description has been given of such an example that the network analyzer 1 has the jig characteristic measuring device 60, there can be similarly realized a case where a semiconductor test device in place of the network analyzer includes the jig characteristic measuring device 60.

According to the embodiment of the present invention, it is possible to measure the jig characteristics of the jig (fixture) 3 used when the circuit parameters of the DUT 2 are measured and calculated. For example, it is possible to measure the reflection characteristics of the signal lines 3a, 3b, 3c, and 3d. Moreover, it is possible to measure the transmission S parameters: S21, S12, S43, S34, S65, S56, S87, and S78 of the signal lines 3a, 3b, 3c, and 3d.

Figure 4:
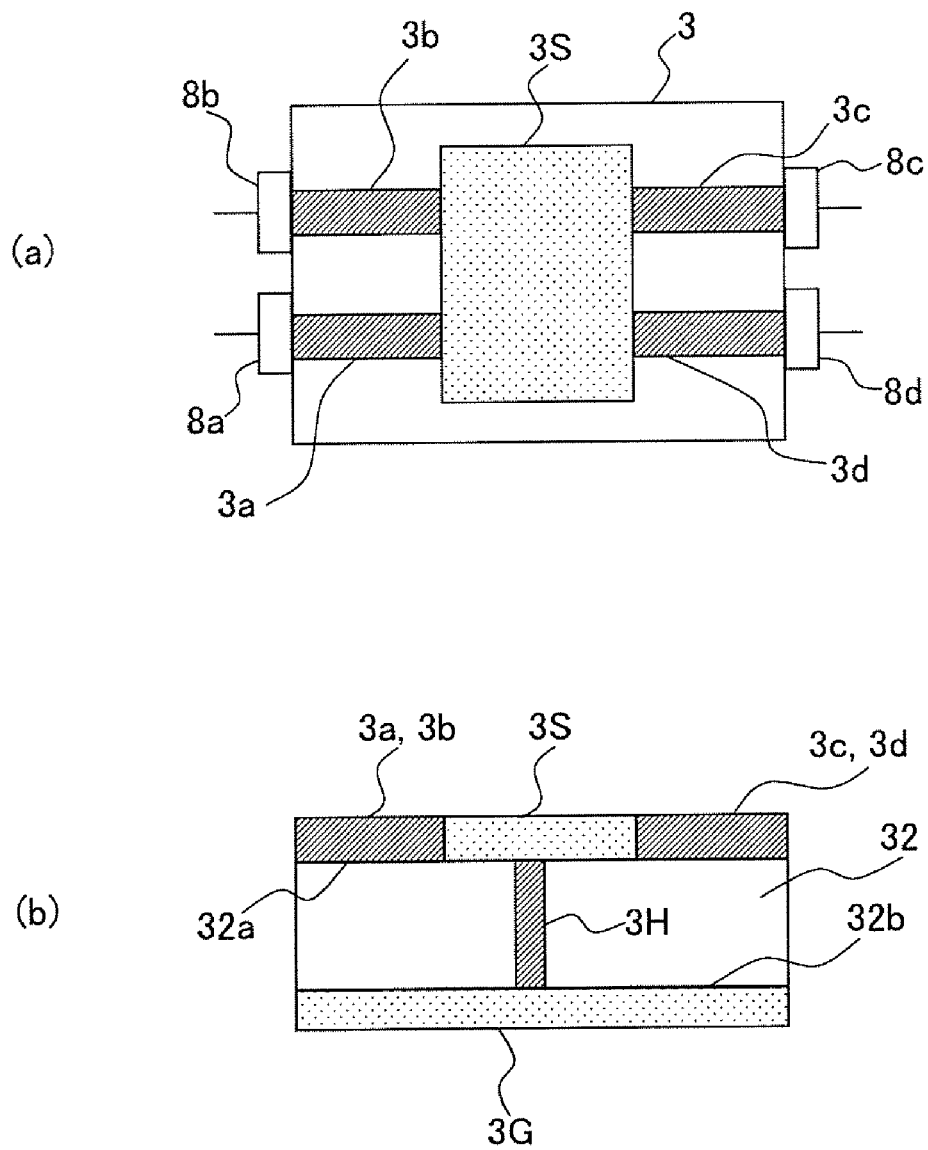
FIG. 4(*a*) and FIG. 4(*b*) are respectively a plan view and a cross sectional view of the jig 3 in the short-circuit state.

Moreover, according to the embodiment of the present invention, when the jig characteristics of the jig (fixture) 3 are measured, the jig 3 should be only in the open state (refer to FIG. 3), and the short-circuit state (refer to FIG. 4). This implies a reduction of labor required for realizing states of the jig 3 compared with the following comparative example.

The comparative example similarly puts the DUT 2 in the open state. However, in place of the DUT 2, any two of the signal lines are directly connected without a resistance (thru). The direct connection enables to measure an error caused by the two signal lines together with an error of the network analyzer 1. According to the comparative example, since two signal lines are directly connected without a resistance, there arise 4×3/2=6 types of state if the DUT 2 has four ports as shown in FIG. 1. Since there are the one type of the open state, and the six types of the directly connected state, it is necessary to realize total of seven types of state to measure errors caused by the signal lines. This requires more labor compared with the embodiment of the present invention which should realize only the two types of state of the jig 3.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the jig characteristic measuring device 60), thereby installing the program on the hard disk. This method may also realize the above-described functions.

The invention claimed is:

1. A connecting element characteristic measuring device that measures a connecting element characteristic of a connecting element that comprises a signal line used to connect a device under test and a measuring device used to measure a characteristic of the device under test with each other, the connecting element characteristic measuring device comprising:

a first reflection coefficient measurer that measures a reflection coefficient of the signal line in an open state where the device under test is not connected to the signal line;

a second reflection coefficient measurer that measures a reflection coefficient of the signal line in a short-circuit state where the signal line is short-circuited; and a connecting element characteristic deriver that derives the connecting element characteristic based on a measured result by the first reflection coefficient measurer, and a measured result by the second reflection coefficient measurer;

wherein said connecting element characteristic deriver derives a square root of an absolute value of a product of the measured result by said first reflection coefficient measurer and the measured result by said second reflection coefficient measurer as the connecting element characteristic.

2. The connecting element characteristic measuring device according to claim 1, wherein:

the connecting element comprises:

a base board that carries the device under test and the signal line on a front surface, and a ground electric potential portion on a rear surface; and a through hole that opens on the front surface, and is connected to the ground electric potential portion.

3. The connecting element characteristic measuring device according to claim 2, wherein the open state is a state where the device under test is not placed on the connecting element.

4. The connecting element characteristic measuring device according to claim 2, wherein the short-circuit state is a state where the signal line and a metalized portion connected to the through hole are placed on the front surface.

5. A network analyzer, comprising:

said connecting element characteristic measuring device according to claim 1, wherein a result obtained by measuring the device under test is corrected based on the connecting element characteristic derived by said connecting element characteristic measuring device.

6. A semiconductor test device, comprising:

said connecting element characteristic measuring device according to claim 1, wherein a result obtained by measuring the device under test is corrected based on the connecting element characteristic derived by said connecting element characteristic measuring device.

7. A connecting element characteristic measuring device that measures a connecting element characteristic of a connecting element that comprises a signal line used to connect a device under test and a measuring device used to measure a characteristic of the device under test with each other, the connecting element characteristic measuring device comprising:

a first reflection coefficient measurer that measures a reflection coefficient of the signal line in an open state where the device under test is not connected to the signal line;

a second reflection coefficient measurer that measures a reflection coefficient of the signal line in a short-circuit state where the signal line is short-circuited; and a connecting element characteristic deriver that derives the connecting element characteristic based on a measured result by the first reflection coefficient measurer, and a measured result by the second reflection coefficient measurer;

wherein said connecting element characteristic deriver derives a one-fourth power of an absolute value of a product of the measured result by said first reflection coefficient measurer and the measured result by said second reflection coefficient measurer as the connecting element characteristic.

8. The connecting element characteristic measuring device according to claim 7, wherein:
the connecting element comprises:
a base board that carries the device under test and the signal line on a front surface, and a ground electric potential portion on a rear surface; and
a through hole that opens on the front surface, and is connected to the ground electric potential portion.

9. The connecting element characteristic measuring device according to claim 8, wherein the open state is a state where the device under test is not placed on the connecting element.

10. The connecting element characteristic measuring device according to claim 8, wherein the short-circuit state is a state where the signal line and a metalized portion connected to the through hole are placed on the front surface.

11. A network analyzer, comprising:
said connecting element characteristic measuring device according to claim 7,
wherein a result obtained by measuring the device under test is corrected based on the connecting element characteristic derived by said connecting element characteristic measuring device.

12. A semiconductor test device, comprising:
said connecting element characteristic measuring device according to claim 7,
wherein a result obtained by measuring the device under test is corrected based on the connecting element characteristic derived by said connecting element characteristic measuring device.

13. A connecting element characteristic measuring method that measures a connecting element characteristic of a connecting element that comprises a signal line used to connect a device under test and a measuring device used to measure a characteristic of the device under test with each other, the connecting element characteristic measuring method comprising:
measuring a reflection coefficient of the signal line in an open state where the device under test is not connected to the signal line;
measuring a reflection coefficient of the signal line in a short-circuit state where the signal line is short-circuited; and
deriving the connecting element characteristic based on the measured reflection coefficient of the open state signal line, and the measured reflection coefficient of the short-circuit state signal line,
wherein the connecting element characteristic is derived by determining a square root of an absolute value of a product of the measured reflection coefficient of the signal line in the open state and the measured reflection coefficient of the signal line in the short-circuit state.

14. A computer-readable medium having a program of instructions for execution by a computer to perform a connecting element characteristic measuring process that measures a connecting element characteristic of a connecting element that comprises a signal line used to connect a device under test and a measuring device used to measure a characteristic of the device under test with each other, the connecting element characteristic measuring process comprising:
measuring a reflection coefficient of the signal line in an open state where the device under test is not connected to the signal line;
measuring a reflection coefficient of the signal line in a short-circuit state where the signal line is short-circuited; and
deriving the connecting element characteristic based on the measured reflection coefficient of the open state signal line, and the measured reflection coefficient of the short-circuit state signal line,
wherein the connecting element characteristic is derived by determining a square root of an absolute value of a product of the measured reflection coefficient of the signal line in the open state and the measured reflection coefficient of the signal line in the short-circuit state.

15. A connecting element characteristic measuring method that measures a connecting element characteristic of a connecting element that comprises a signal line used to connect a device under test and a measuring device used to measure a characteristic of the device under test with each other, the connecting element characteristic measuring method comprising:
measuring a reflection coefficient of the signal line in an open state where the device under test is not connected to the signal line;
measuring a reflection coefficient of the signal line in a short-circuit state where the signal line is short-circuited; and
deriving the connecting element characteristic based on the measured reflection coefficient of the open state signal line, and the measured reflection coefficient of the short-circuit state signal line,
wherein the connecting element characteristic is derived by determining a one-fourth power of an absolute value of a product of the measured reflection coefficient of the signal line in the open state and the measured reflection coefficient of the signal line in the short-circuit state.

16. A computer-readable medium having a program of instructions for execution by a computer to perform a connecting element characteristic measuring process that measures a connecting element characteristic of a connecting element that comprises a signal line used to connect a device under test and a measuring device used to measure a characteristic of the device under test with each other, the connecting element characteristic measuring process comprising:
measuring a reflection coefficient of the signal line in an open state where the device under test is not connected to the signal line;
measuring a reflection coefficient of the signal line in a short-circuit state where the signal line is short-circuited; and
deriving the connecting element characteristic based on the measured reflection coefficient of the open state signal line, and the measured reflection coefficient of the short-circuit state signal line,
wherein the connecting element characteristic is derived by determining a one-fourth power of an absolute value of a product of the measured reflection coefficient of the signal line in the open state and the measured reflection coefficient of the signal line in the short-circuit state.

* * * * *